United States Patent [19]

Beha et al.

[11] Patent Number: 4,843,329

[45] Date of Patent: Jun. 27, 1989

[54] METHOD FOR CONTACTLESS TESTING FOR ELECTRICAL OPENS AND SHORT CIRCUITS IN CONDUCTING PATHS IN A SUBSTRATE

[75] Inventors: Johannes G. Beha, Waedenswil; Armin U. Blacha, Rueschlikon; Rolf Clauberg, Gattikon; Hugo K. Seitz, Wollerau, all of Switzerland

[73] Assignee: International Business Machines Corporation, Armonk, N.Y.

[21] Appl. No.: 107,433

[22] Filed: Oct. 9, 1987

[30] Foreign Application Priority Data

Oct. 23, 1986 [EP]  European Pat. Off. ........ 84114711.4

[51] Int. Cl.⁴ .............................................. G01R 15/12
[52] U.S. Cl. .................................. 324/73 PC; 324/96; 324/501; 324/158 R; 356/389; 364/481
[58] Field of Search ............... 324/71.3, 73 R, 73 PC, 324/158 R, 158 D, 501, 96; 364/483, 480, 481, 482; 356/237, 389, 391, 425

[56] References Cited

U.S. PATENT DOCUMENTS

| | | |
|---|---|---|
| 3,436,651 | 4/1969 | Helms et al. |
| 4,640,002 | 2/1987 | Phillips et al. ............. 324/158 D X |
| 4,644,264 | 2/1987 | Beha et al. ........................ 324/73 R |
| 4,670,710 | 6/1987 | Beha et al. ........................ 324/73 R |
| 4,703,260 | 10/1987 | Beha et al. ................... 324/73 R X |
| 4,736,159 | 4/1988 | Shiragasawa et al. ..... 324/158 D X |

FOREIGN PATENT DOCUMENTS

| | | |
|---|---|---|
| 0128107 | 12/1984 | European Pat. Off. |
| 0180780 | 5/1986 | European Pat. Off. |
| 2380556 | 9/1978 | France |

OTHER PUBLICATIONS

Wiza, "Microchannel Plate Detectors", *Nuclear Instruments and Methods*, vol. 162, 1979, pp. 587–601.
IBM TDB., vol. 27, No. 10B, Mar. 1985, p. 5959, "Photoelectric Test Method for PCB Conductors".
IBM TDB, vol. 25, No. 3A, Aug. 1982, p. 1171, "Contactless Measurement of Voltage Levels Using Photoemission".
Review Sci. Instruments, vol. 49, No. 6, Jun. 1978, pp. 756–756, "Computer Controlled ESCA for Non-Destructive Surface Characterization Utilizing a TV-Type Position Sensitive Detector".
Nuclear Instruments and Methods in Physics Research, vol. 208, No. 1/3, Apr. 1983, pp. 373—377, "Project of a Photoelectron X-Ray Microscope on ACO Storage Ring".
Nuclear Instruments and Methods in Physics Research, vol. 208, No. 1/3, Apr. 1983, "A Display Type Analyzer With an Image Processing System for Angle-Resolved Photoelectron Spectroscopy", pp. 777–784.

*Primary Examiner*—Reinhard J. Eisenzopf
*Assistant Examiner*—Warren S. Edmonds
*Attorney, Agent, or Firm*—Daniel P. Morris

[57] ABSTRACT

A method for contactlessly testing for opens and shorts in conducting paths within or on a nonconducting substrate. There are a plurality of conducting pads on the surface of the substrate. Charges are contactlessly generated, e.g., by an optical beam, in at least one selected pad inducing a voltage thereon and on pads electrically connected therewith through one of the conducting paths. A two dimensional electron flux is contactlessly caused to be emitted from the selected pad and at least one other pad of the plurality of pads, e.g., by an optical beam. The flux emitted from the pads depends on the voltage on each pad. The flux is detected to distinguish pads in electrical connection.

18 Claims, 4 Drawing Sheets

FIG. 4A
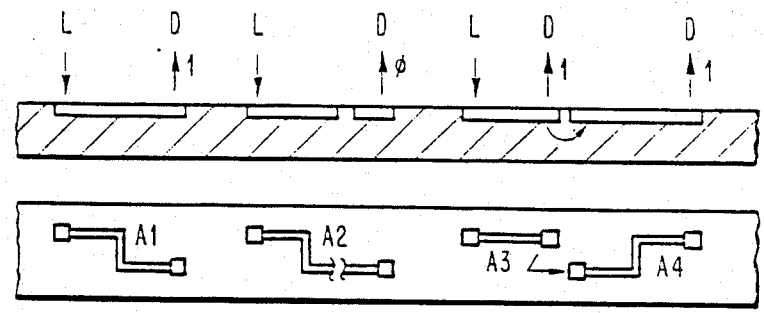
FIG. 4B
FIG. 4C
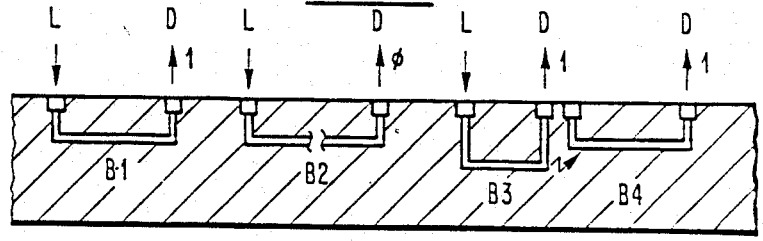
FIG. 4D
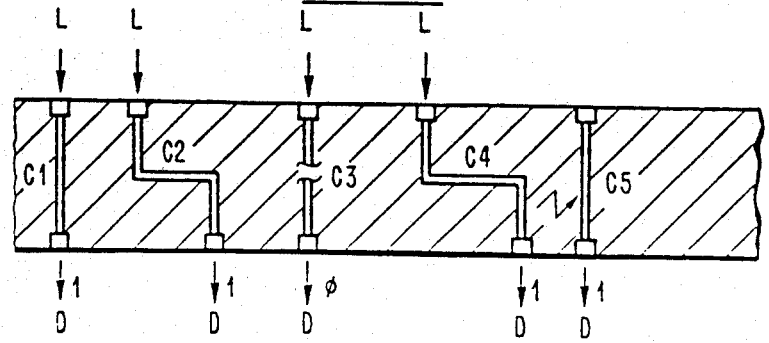

METHOD FOR CONTACTLESS TESTING FOR ELECTRICAL OPENS AND SHORT CIRCUITS IN CONDUCTING PATHS IN A SUBSTRATE

CROSS REFERENCES TO RELATED COPENDING APPLICATIONS

Copending U.S. patent application Ser. No. 07/107,441 filed on the same date as the present application entitled "METHOD FOR CONTACTLESS TESTING OF CONDUCTING PATHS IN A SUBSTRATE USING PHOTON-ASSISTED TUNNELING" of J. G. Beha et al, and assigned to the same assignee as the present invention, describes a method for contactless testing the integrity of conducting path on or in a substrate, by executing the following steps: (I) selected pads are irradiated by an optical beam so that they are positively charged due to photoemission of electrons. The charges propagate through existing conductors so that all selected pads and all pads connected to them assume a specific voltage. (II) The whole surface is irradiated by a flooding optical beam. Photoemission of electrons will now occur from those pads which were not charged previously. (III) The photoelectrons emitted in step II are detected thus revealing the spatial distribution of uncharged pads, permitting detection of line opens and shorts of conducting paths.

FIELD OF INVENTION

The present invention is concerned with the testing of electrical connecting in substrates, and in particular with the testing of interconnection lines and via connections in circuit boards for packaging integrated circuit chips. It is generally suited for testing conducting lines and via connections in substrates.

BACKGROUND

The testing of integrated circuits and of their interconnections in packaging is an important task in the manufacturing of electronic and data processing equipment. It is particularly important that the testing methods are fast and do not require much preparatory operations for their execution.

In principle, testing can be done by applying power and data signals to circuitry and extracting resulting data signals and electrical conditions from circuitry through the regular connection pins or through mechanical contact probes. Such testing is, however, slow and not very effective because of the limited number of connections which can be made. It is therefore not well suited for highly integrated circuits and dense packaging which are used today.

Therefore, some methods of contactless testing have been recently suggested using either electron beam or laser technology. E-beam testing was described in an article by E. Menzel et al.: "Fundamentals of Electron Beam Testing of Integrated Circuits", published in Scanning, Vol. 5 (1983), pp. 103-122. The E-beam is used as a contactless probe, either in a passive or active mode. However, the utilization of electron beams for testing has certain disadvantages and limitations. Scanning or flooding a substrate by an E-beam leads also to the charging of the substrate because the incident electrons have energies much larger than the work function of the substrate, i.e. they produce secondary electrons. This strongly influences the voltage contrast between different points on a substrate and hinders the measurements. Furthermore, reflected high energy electrons strongly complicate simultaneous measurement for many different points using position-sensitive detectors because these high energy electrons must be separated from the lower energy electrons which carry the required information.

More recently, the use of an optical beam, e.g. a laser beam, for integrated circuit testing has been suggested. The photons of a laser beam can excite electron emission from the target, and the laser beam can thus be used for contactless testing of electronic circuitry.

European Patent Application No. 0,205,760 (U.S. counterpart issued as U.S. Pat No. 4,670,710) entitled "Noncontact Testing of Integrated Circuits" discloses a technique of directing a laser beam in a scanning motion to lines of test points so that photoelectrons are generated in dependance of the operating conditions of those test points. The generated electrons are then directed to a two-dimensional array electron detector so that an analysis can be made.

In European Patent Application No. 0,216,077 (U.S. counterpart application Ser. No. 778,823 filed Sept. 23, 1985) a testing procedure is described in which laser light is directed to the entire surface of a circuit chip, and in which that laser light causes generation of photoelectrons in dependance of the voltage present at each point. The electrons generated are directed either to a luminescent target whose image is then evaluated, or the electrons are directed to channel plates and further to a luminescent target and an optical processing system.

In both systems disclosed in the two above-mentioned European patent applications, power and test data signals have to be applied to the tested circuits through normal pins and chip connections, to bring them into an operating status that is to be detected in the testing procedure. This is a limitation of the testing possibilities.

OBJECTS OF THE INVENTION

It is a primary object of present invention to provide a testing method which is completely contactless and thus does not require the establishment of connections for the application of power and test data to the circuits to be tested.

It is a further object of this invention to devise a testing method which is particularly suited for testing the conducting lines in packaging boards for integrated circuitry.

Another object of the invention is to provide a testing procedure which does not require application of electron beams and which thus can achieve high voltage contrasts.

A further object is a testing method which enables simple, fast and simultaneous testing of via connections through a substrate.

DISCLOSURE OF THE INVENTION

In the invented method for achieving these objects, an optical beam, e.g. a laser beam, is first applied to predetermined pads of circuitry on a substrate to cause photoemission therefrom so that they are charged positively; this will bring these predetermined pads and all conducting lines and pads connected to each of them to a particular voltage level. Thereafter, the same or another optical beam is directed to the board surface a second time to excite photoemission from pads, whose intensity is now depending on the voltage previously established at each pad. The photoelectrons can be detected by being directed to a channel plate arrangement for amplification, and the resulting pattern of intensities is evaluated to thus detect which pads are actually in electrical connection with the predetermined pads and which are not.

This method has the advantage that it can be used for surface lines, buried lines, as well as for via connections. It allows the simultaneous testing of several connections which is e.g. not possible with E-beam technology.

These and other objects, features and advantages will be apparent from the following more particular description of the preferred embodiments.

LIST OF DRAWINGS

FIG. 4A, FIG. 4B, FIG. 4C and FIG. 4D illustrate the testing possibilities of the invention for different line structures and connections.

DETAILED DESCRIPTION

(1) Principle of Invention

The testing procedure of the present invention is of primary interest for packaging, i.e. for testing the circuits and conducting lines which are provided between pads on circuit boards. Such circuit boards are used for carrying and interconnecting individual chips which were tested already previously.

Figure 1A:
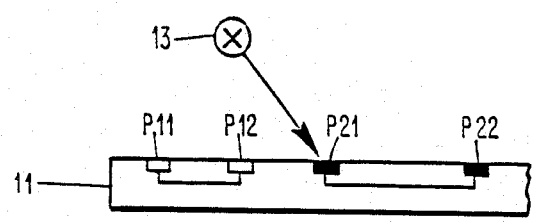
FIG. 1A, FIG. 1B and FIG. 1C are a schematic representation of the sequential steps of the invented testing method for testing connections between pads on one side of a circuit board.
Figure 1B:
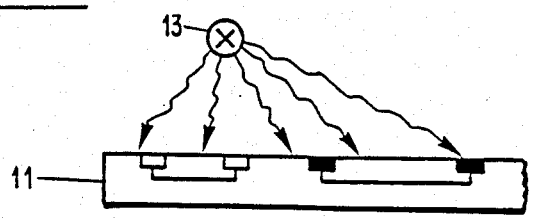
Figure 1C:
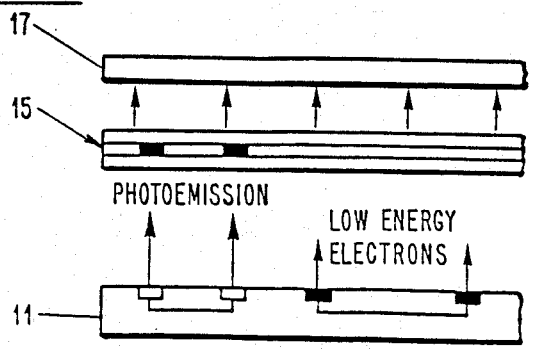

FIG. 1 is a schematic representation of the new testing method. The three main steps of the method are represented in the three portions FIG. 1A, FIG. 2B and FIG. 1C of the drawing. Electrons photoemitted from a surface into a nonevacuated ambient such as air can interact with the atoms or molecules on the ambient decreasing the number of photoemitted electrons available for detection. It is therefore the preferred embodiment that the testing be done in vacuum, to enhance photoemitted collection of the electrons photoemitted from a surface which is irradiated by an optical beam.

For convenience, the invention will be further described in terms of the use of a laser as the source of an optical beam. However, it should be understood that the method is not limited to the use of a laser. In the first step (I) shown in FIG. 1A, a substrate 11, e.g., a circuit board, containing the circuits or conductors to be tested is subjected to a laser beam from laser device 13, e.g., an ultraviolet laser. The laser beam can be directed to selected spots on the board 11 by a scanning mechanism, and it can be switched on and off. There are shown two pairs of pads P11/P12 and P21/P22, each pair being interconnected by a conductor which is to be tested. For a conductor on the surface of the substrate, the pad can be any part of the conductor. For a conductor within the substrate, a pad is an extension of the conductor to the surface of the substrate. In this first step, one of the pads, e.g. P21, is subjected to the laser beam. Due to photoemission from the conducting material at this spot, pad 21 will be charged positively, but not the surrounding insulator surface of board 11. The reason for this good contrast is the fact that the photon energy for the laser irradiation is chosen such that it is large enough to excite photoelectrons from the metallic pads, but is too small to excite photoelectrons from the insulating substrate, for example, a ceramic substrate. A grid can be provided for collecting the generated photoelectrons (as discussed in section 2).

The charges collecting on the selected pad P21 will propagate through all portions of the electrical circuitry which are connected to P21, in this case through the conductor to pad P22. Thus, at the end of step (I), P21 and also P22 should be at a different potential than all other surface spots of the board, if the circuitry between P21 and P22 is intact. However, if there would be a discontinuity in the conductor between P21 and P22, P22 would not be at the higher potential; furthermore, if there would be a short circuit connection between P21 and P12, the charges would distribute to both pads P12 and P11 so that both would be at the higher potential which is also present on P21 and P22. The specific voltage level at the selected pads and pads connected to them will depend on the laser power used, the irradiation time, and the conductor material.

Therefore, by first selectively charging selected points of the circuitry to be tested, and then detecting on which non-irradiated spots the higher potential appears, defects in the circuitry or conductors can be determined. Steps (II), shown in FIG. 1B, and (III), shown in FIG. 1C, are executed for the detecting operation which actually is a voltage-contrast measurement. In step (II), the whole surface of board 11 is flooded by a wide-spread laser beam from laser device 13. This will cause photoemission from all metallic points. But the electrons from the previously charged spots will have a lower kinetic energy than the electrons from uncharged spots. These lower energy electrons will not be able to pass through a barrier to a detection arrangement. Thus, there will be no detectable photoemission from these metallic spots which are at a higher potential than the other metallic spots on the surface of board 11; in the case of intact circuitry, these spots would be pads P21 and P22 in the present example.

In step (III), shown in FIG. 1C, the electron flux pattern photoemitted from noncharged metallic surface areas is detected. One method of detection is an arrangement of channel plates 15 and a position-sensitive detector 17. Such channel plates 15 are a high-density array of electron multiplier plates and are well known. They produce a high gain in the photoelectron flux intensity. Position-sensitive detector 17 which may be a luminescent phosphor plate or a semiconductor plate of which each spot can be charged separately reveals the spatial distribution of detected electrons which is an indication of the location of all uncharged metallic spots on the board's surface. This spatial information can be converted to time-sequential data sequence and then e.g. be stored or directly processed in a computer for obtaining the test results. Electrical grid means are provided for example, between the board 11 and the channel plates 15, to supply an electric field to collect the higher energy photoelectrons and to refuse the lower energy photoelectrons. These details will be explained in the following section 2.

Testing of Via Connections

Figure 2A:
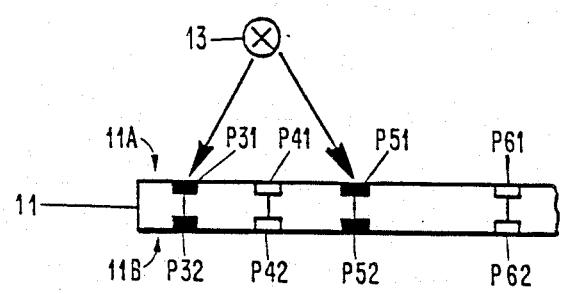
FIG. 2A, FIG. 2B and FIG. 2C are a schematic representation of the sequential steps of the invented method for testing via connections.
Figure 2B:
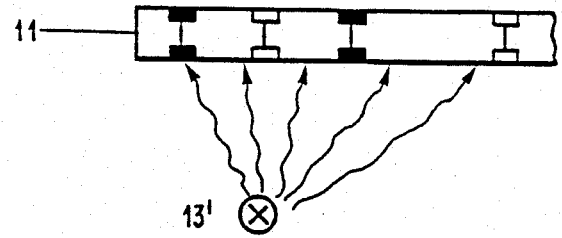
Figure 2C:
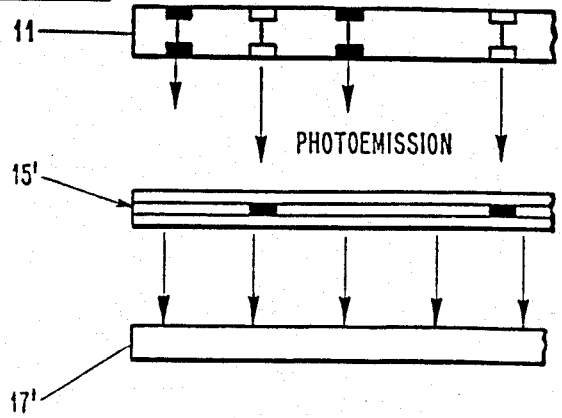

So far, the testing was only done on one side of the board. For testing via connections, i.e. conductors between pads on different surfaces of the board, the board would either have to be turned over after step (I), shown in FIG. 1A,—if the induced charges sustain for a sufficient long time—or a flooding laser and the channel plate/detector arrangement would have to be provided on the other side of the board, as is shown in FIG. 2. In the case of FIG. 2, via connections are provided between pairs of pads P31/P32 ... P61/P62, respectively, which are located on opposite sides 11A and 11B of the board. Otherwise, procedure steps I, II, and III, shown in FIG. 2A, FIG. 2B and FIG. 2C respectively, correspond to those described in connection with FIG. 1.

There is of course also the possibility of testing all via connections in a board simultaneously. In this case, step (I), shown in FIG. 2A, of the procedure would consist of flooding the whole surface area 11A with a laser beam to charge all via pads located on that side of the board. Then, for all intact vias the respective pads on the other surface 11B would be charged; for each interrupted via, the corresponding pad on the other surface 11B would have no charge. Steps (II) and (III), shown in FIG. 2B and FIG. 2C respectively, for simultaneous via testing are the same as for individual via testing: flooding of the whole other surface 11B by a laser beam, and detecting the photoemission pattern by the channel plate/detector arrangement.

(2) Embodiment of a Testing Facility Using the Invention

Figure 3:
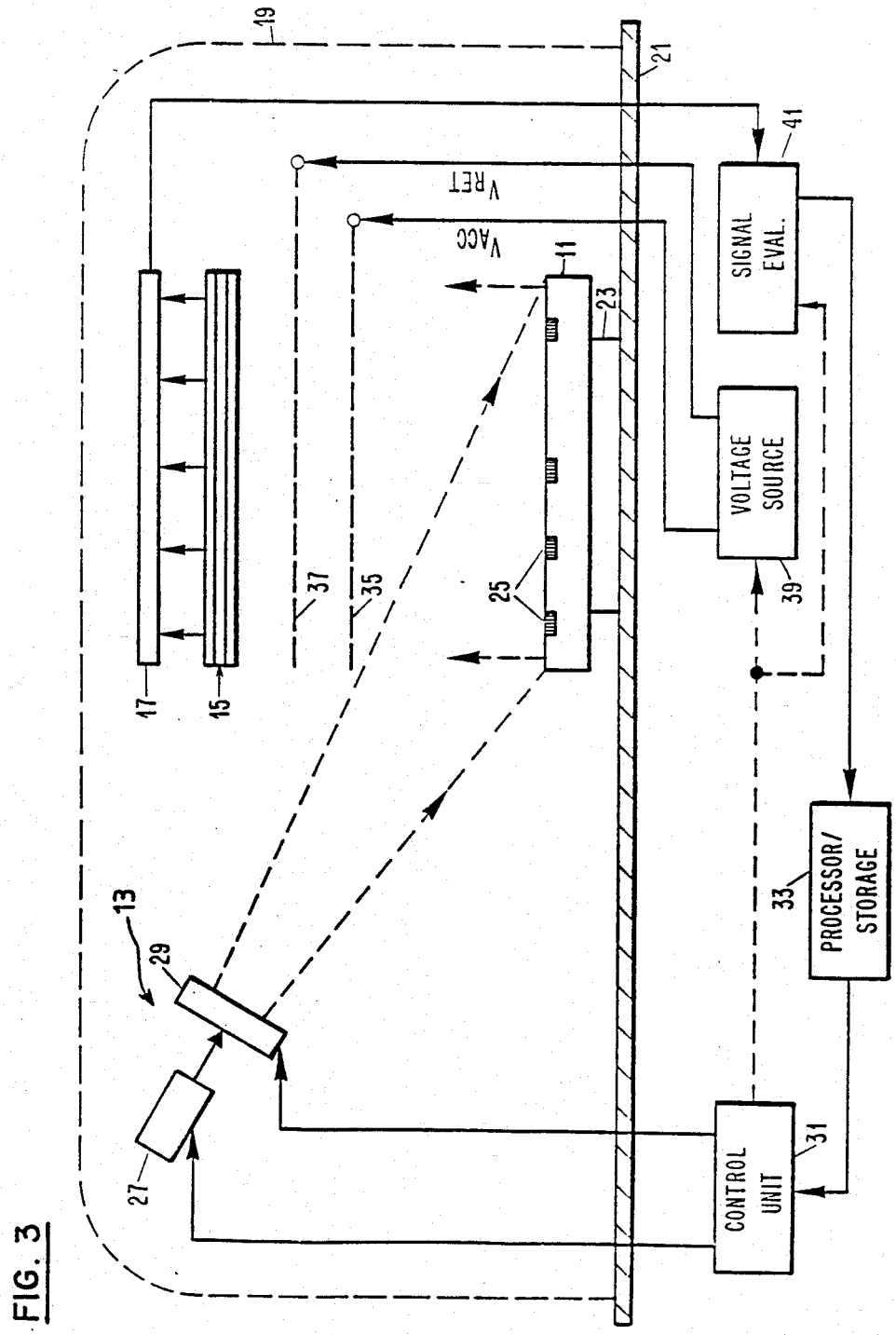
FIG. 3 shows the essential components and their interrelationship in a testing facility for executing the invented method.

FIG. 3 illustrates a testing facility in which the invention is used. This facility includes a vacuum chamber 19 having a base plate 21. A support 23 is provided for holding circuit board (package substrate) 11. On the surface of board 11, electrical connection pads 25 are shown schematically. Circuits or conductors to be tested are not shown in this drawing.

Laser device 13 comprises a source 27 of ultraviolet laser light and a scanner/flooder arrangement 29. Scanner/flooder 29 is a suitable means for focusing and deflecting the laser beam emitted from source 27 to selected points on board 11, or for providing a wide-angle laser beam covering the whole surface of board 11. The scanner/flooder may be a commercial system as used in purely optical laser scanning microscopes, based on a rotating polygon mirror plus focusing/beam spreading objective. As such focusing and deflection means are well known they need not be described here in more detail.

A control unit 31 is provided for furnishing suitable control signals for laser source 27 (switching the beams on and off) and for scanner/flooder 29 (coordinate signals for selected points to be charged for testing, or control signal for providing a wide-angle laser beam). The basic data for any testing procedure are stored in a processor/storage 33, and are furnished to control unit 31.

Channel plates 15 are provided for receiving in true spatial relationship the photoelectrons emitted from the surface of board 11 in response to the flooding by a laser beam in step (II), shown in FIG. 1B. Two grids are provided to supply electric field for collecting photoelectrons from selected pads in step (I), shown in FIG. 1A and for achieving a good transfer of photoelectrons to the channel plate arrangement in step (II): An accelerating grid 35 which has an electrical potential ($V_{ACC}$) that attracts and thus accelerates the photoelectrons from board 11. A typical potential for this grid 35 would be 100 Volts. To refuse the lower energy photoelectrons and thus to enable voltage discrimination, a retarding grid 37 is provided which has a retarding potential ($V_{RET}$) to slow down the electrons which have passed grid 35. A typical potential for this grid 37 would be between $-10$ Volts and $+10$ Volts. A voltage source 39 is provided for furnishing the potentials ($V_{ACC}$) and ($V_{RET}$) to the grids. It receives control signals for selecting the correct grid potentials from control unit 31.

The electrons furnished by channel plates 15, which represent the spatial distribution of potentials of metallic spots on the surface of board 11 propagate to position-sensitive detector 17. If this is a luminescent layer, its image can be recorded by a TV camera. The scanning signals of this camera which are sequential representation of the spatial illumination distribution on detector 17 can then be evaluated. If the detector is a chargeable semiconductor plate it can be read out directly by a commercial charge coupled device (CCD) camera which acts as a signal evaluator 41. This signal evaluator furnishes the test result data sequentially to processor/storage unit 33 from where they can be extracted for a final evaluation of the test, or for producing a printout of the test results for the respective board.

(3) Circuit/Conductor Configurations Which Can be Tested

FIG. 4 illustrates the different basic testing possibilities which are available when using the testing method of present invention. In FIG. 4A there are shown a few simple connections A1, A2, A3, and A4 between pairs of pads. All of these connections are located at the surface of the board, as can be seen in the sectional side view. For testing, a laser beam is first selectively directed to the left pad of connection A1, A2, or A3 in method step I (each connection is separately tested). In the figure, this is indicated by an arrow with an "L". The detection in method step III is indicated by an arrow with a "D". For normal connection A1 the detection will show that the charges have propagated to the right pad (indicated by a "1"). For interrupted connection A2, th expected potential will not be detected at the right pad (indicated by a "0"). For normal connection A3 the result at the right pad is the same as for A1. However, a short circuit is assumed between A3 and A4. Thus, though no laser beam was directed to a pad of connection A4, the detection step after charging a pad of A3 will result in a high potential indication from the pads of A4 (indicated by a "1" on the right pad.

In FIG. 4C, there are shown four buried connections Ba, B2, B3, and B4 between pairs of surface pads. The buried conductors are neither visible nor can they be charged by a laser beam, but they can nevertheless be tested by the method of the invention. The explanations given for FIG. 4A with respect to selective charging of pads by laser and subsequent detection of the resulting potentials on pads apply also to the situation of FIG. 4C.

In FIG. 4D, there are shown several via conductors which interconnect pads located on opposite surfaces of the board. As was mentioned already, these via connections can also well be tested by the method of the invention. The only difference with respect to situations (A) and (B) is that the initial selective charging by a laser beam (L) in method step I is done on one surface of the board, whereas detection of resulting potential distribution (D) by method steps II and III is done on the other surface of the board.

Of course, a substrate such as a circuit board or a package substrate to be tested can have any combination of the electrical connections shown in FIG. 4A, FIG. 4B, FIG. 4C and FIG. 4D, and there can be more complicated connections (branched conductors, conductor networks, etc.). When the testing is done in suitable sequential steps, each separate "network" can be tested for integrity, and shortcut circuits between "networks" will also be detected easily.

It is of course also possible to test different connecting lines or via connections simultaneously, e.g., if the connections which are tested simultaneously have so much distance from each other that shortcuts between them are not possible.

(4) Comparison of Speeds for E-Beam Testing and for Laser Testing

In E-beam testing technology, there are problems with the separation of high-energy (reflected beam) electrons from low-energy (secondary) electrons if one uses position-sensitive detection. With E-beams, the high-energy electrons of the reflected E-beam (about 1,000 eV) would also reach the channel plates and destroy the voltage contrast information because this information about the voltages is in the low-energy electrons. In photoemission, there are only the electrons emitted with energies in the range 0 eV to 1 eV which also contain the information about the voltages on the surface of the investigated sample.

If the measurement or loading time for a single point is comparable in E-beam and in photoemission technology, the flooding approach which is only useful with optically-excited photoemission leads to a much smaller total measuring time for this latter technique. In testing, one finds that the measuring time for a single spot is four times larger in E-beam technology than with photoemission. For full package testing which allows the flooding approach, the improvement is therefore much larger.

While the invention has been illustrated and described with respect to preferred embodiments, it is to be understood that the invention is not limited to the precise constructions herein disclosed, and the right is reserved to all changes and modifications coming within the scope of the invention as defined in the appended claims.

The preferred embodiment of the invention is photoelectrically removing electrons from a conducting pad on a substrate, but not removing electrons from the substrate, to induce a voltage on the pad and thereafter photoelectrically causing a flux of electrons to be emitted from pads on the substrate surface but not from the substrate to distinguish pads which are in electrical connection. It will be recognized by those of skill in the art that other means for contactless, generating charges in a pad and for contactlessly generating an electron flux can be used to practice the invention, such as for example using a fine positively charged probe tip to extract electrons from a pad and thermionically causing electrons to escape from the contact pads by localized heating of the substrate.

We claim:

1. A method of testing the integrity of conducting paths within or on a circuit substrate consisting of non-conducting material, each said conducting path being connected to at least two uncovered pads on any one face of said substrate, comprising:

(a) generating charges in at least one selected pad on one face of said substrate by focusing an optical beam onto said selected pad, the energy of said beam being sufficient to cause photoelectron emission from each selected pad but insufficient to cause photoelectron emission from said nonconducting substrate material, said photoelectron emission inducing a specific voltage level in each selected pad and in each nonselected pad which is electrically connected to said selected pad;

(b) thereafter, causing voltage-dependent photoelectron emission from pads on any one face of said substrate by irradiating said face with a flooding optical beam, of sufficient energy to cause said voltage-dependent photoelectron emission, the magnitude of said voltage-dependent photoelectron emission from each pad depends on the voltage thereon; and (c) detecting said voltage dependent photoelectron emission to distinguish pads in electrical connection with said at least one selected pad.

2. The method of claim 1, wherein said method is carried out in vacuum.

3. The method of claim 1, wherein steps (a), (b), and (c) are all conducted on the same face of said substrate, for testing the integrity of electrical connections between at least one pair of pads, both of which being located on the same face of said substrate.

4. The method of claim 1, wherein step (a) is conducted on a first face of said substrate, and steps (b) and (c) are conducted on a second face of said substrate, for testing the integrity of conducting via connections extending within said substrate from at least one pad on said first face to at least one pad on said second face.

5. The method of claim 4, wherein said substrate is turned over by 180 degrees between step (a) and step (b), so that said step of generating charges and said step of detecting can be done from one side of the location of said substrate.

6. The method of claim 4, wherein said substrate is not moved during the whole testing operation, said charges being generated by focusing said optical beam onto said selected pads from a first side of said substrate's location, and said voltage-dependent photoemission being caused by directing said flooding optical beam from a second side of said substrate's location, said voltage-dependent photoemission being detected from said second side.

7. The method of claim 1, further comprising prior to said step of detecting:

accelerating the electrons emitted by voltage-dependent photoelectron emission away from said substrate by providing an accelerating voltage, and providing a retarding voltage to substantially prevent electrons emitted from pads having a voltage level induced thereon from being detected.

8. The method of claim 1, wherein said voltage-dependent photoelectron emission is detected by evaluating the output of a position-sensitive channel plate arrangement located in the vicinity of said substrate face irradiated with said flooding optical beam.

9. The method of claim 8, wherein the output of said position-sensitive channel plate arrangement is evaluated by exciting a pattern in an electoluminescent layer, said pattern being detected by a scanning electronic camera.

10. A method of testing the integrity of conducting via connections in a circuit substrate consisting of nonconducting material, each of said via connections having one pad on a first surface of said substrate and at least one pad on a second surface of said substrate, comprising:

(a) generating charges in all pads on said first surface by flooding onto said first surface an optical beam having energy sufficient to cause photoelectron emission from said pads but insufficient to cause photoelectron emission from said non-conducting substrate material, said photoelectron emission inducing a voltage in each pad on said first surface and in each pad on said second surface which is electrically connected to a pad on said first surface;

(b) thereafter, causing voltage-dependent photoelectron emission from pads on said second surface by irradition with a flooding optical beam of sufficient energy to cause said voltage-dependent photoemission, the magnitude of said voltage-dependent photoemission from each pad depends on the voltage thereon; and (c) detecting the pattern of said voltage-dependent photoelectron emission to distinguish pads on said second surface in electrical connection with pads on said first surface.

11. A method for contactlessly testing the integrity of conducting paths within or on a nonconducting substrate, there being a plurality of pads on the surface of said substrate, comprising;

contactlessly generating charges in at least one pad of said plurality of pads inducing a voltage thereon and on pads electrically connected therewith through one of said conducting paths, substantially no charges being generated in said substrate;

contactlessly causing a two dimensional electron flux to be emitted from said at least one pad and from at least one other pad of said plurality of pads, said flux emitted from each pad depending on the voltage thereon, substantially no electron flux being emitted from said substrate; and detecting the two dimensional voltage dependent electron flux being emitted from said at least one pad and from said at least one other pad of said plurality of pads to distinguish pads in electrical connection with said at least one pad, pads in electrical connection with said at least one pad emitting substantially the same flux, pads not in electrical connection with said at least one pad emitting a different flux than said at least one pad.

12. The method of claim 11, wherein charges are contactlessly generated in said at least one pad by directing a first optical beam thereon sufficiently focused and of sufficient energy to photoelectrically remove electrons therefrom, the energy of said first optical beam being insuffficient to generate charges in said substrate and wherein said electron flux is emitted from said plurality of pads by directing a second optical beam thereon, said second optical beam being sufficiently focused and of sufficient energy to photoelectrically emit electrons from said plurality of pads, the energy of said second optical beam being insufficient to emit electrons from said substrate.

13. The method of claim 11, wherein said method is carried out in vacuum.

14. The method of claim 11, wherein said two dimensional electron flux is detected by directing said flux onto an electroluminescent layer exciting a pattern therein and by measuring said pattern.

15. The method of claim 12, wherein said first and said second optical beams are laser beams.

16. The method of claim 11, further comprising, prior to said step of detecting said two dimensional voltage dependent flux being emitted from said plurality of pads, applying an electric field to direct said electron flux away from said substrate and to substantially prevent electrons emitted into said electric field from a pad having a voltage induced thereon from passing through said electric field.

17. The method of claim 16, wherein the electron flux passing through said electric field is amplified prior to said step of detecting.

18. The method of claim 16 wherein the electron flux emitted from said plurality of pads is amplified prior to said step of applying said electric field.

* * * * *